(12) United States Patent
Chern et al.

(10) Patent No.: US 9,660,647 B2
(45) Date of Patent: May 23, 2017

(54) CALIBRATION DEVICE AND MEMORY SYSTEM HAVING THE SAME

(71) Applicant: SK hynix memory solutions inc., San Jose, CA (US)

(72) Inventors: Jenn-Gang Chern, Redwood City, CA (US); Yukeun Sim, Santa Clara, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 0 days.

(21) Appl. No.: 14/924,389

(22) Filed: Oct. 27, 2015

(65) Prior Publication Data

US 2016/0118984 A1 Apr. 28, 2016

Related U.S. Application Data

(60) Provisional application No. 62/068,923, filed on Oct. 27, 2014.

(51) Int. Cl.
| | |
|---|---|
| *H03K 19/00* | (2006.01) |
| *G11C 7/00* | (2006.01) |
| *G05F 3/26* | (2006.01) |
| *G11C 7/10* | (2006.01) |
| *G11C 29/02* | (2006.01) |
| *G11C 29/50* | (2006.01) |

(52) U.S. Cl.
CPC .......... *H03K 19/0005* (2013.01); *G05F 3/26* (2013.01); *G11C 7/00* (2013.01); *G11C 7/10* (2013.01); *G11C 29/021* (2013.01); *G11C 29/028* (2013.01); *G11C 29/50008* (2013.01)

(58) Field of Classification Search
CPC ......... H03K 19/0005; G05F 3/26; G11C 7/00; G11C 7/10; G11C 29/021; G11C 29/028; G11C 29/50008
USPC .................................................... 365/189.02
See application file for complete search history.

(56) References Cited

U.S. PATENT DOCUMENTS

| | | | | |
|---|---|---|---|---|
| 4,608,657 A | * | 8/1986 | Manome ................ | G01R 35/00 324/601 |
| 5,359,233 A | * | 10/1994 | Mumper ................ | H03K 17/22 327/143 |
| 5,493,533 A | * | 2/1996 | Lambrache ............ | G11C 16/28 365/175 |
| 6,356,161 B1 | * | 3/2002 | Nolan ................... | H03K 3/0231 331/111 |
| 6,888,482 B1 | * | 5/2005 | Hertle ................. | H03M 1/1014 341/120 |
| 6,894,501 B1 | * | 5/2005 | Flasck ................. | G11C 29/028 324/416 |

(Continued)

*Primary Examiner* — Vu Le
*Assistant Examiner* — Sung Cho
(74) *Attorney, Agent, or Firm* — IP & T Group LLP (57) ABSTRACT

A calibration device for use in a memory system includes a bias circuit providing bias current, and a calibration unit generating a control signal for calibration. The bias circuit includes an internal resistor and measures a second bias current generated by mirroring a first bias current through the internal resistor, and adjusts the second bias current to generate the second bias current in a predetermined range as a third bias current. The calibration unit generates the control signal based on a comparison result between a reference voltage and a voltage generated based on the third bias current through an adjustable resistor.

16 Claims, 10 Drawing Sheets

(56) References Cited

U.S. PATENT DOCUMENTS

| | | | |
|---|---|---|---|
| 7,898,761 B1* | 3/2011 | Voo | G11B 5/3906 360/66 |
| 8,044,702 B2* | 10/2011 | Niederberger | G01K 7/01 327/513 |
| 8,067,992 B2* | 11/2011 | Chen | H03K 3/011 331/111 |
| 8,983,789 B1* | 3/2015 | Voo | G01R 35/005 327/530 |
| 2003/0154045 A1* | 8/2003 | Sung | H03M 1/165 702/107 |
| 2004/0124850 A1* | 7/2004 | Koneru | G01R 35/005 324/601 |
| 2004/0247325 A1* | 12/2004 | Watanabe | H04B 10/504 398/188 |
| 2009/0034650 A1* | 2/2009 | Norimatsu | H04L 25/06 375/295 |
| 2009/0085684 A1* | 4/2009 | Guo | H03L 1/02 331/176 |
| 2009/0085685 A1* | 4/2009 | Guo | H03L 1/02 331/185 |
| 2010/0120390 A1* | 5/2010 | Panikkath | G01R 13/02 455/208 |
| 2012/0075016 A1* | 3/2012 | Visser | H03F 1/56 330/116 |
| 2013/0257491 A1 | 10/2013 | Won et al. | |
| 2013/0335135 A1* | 12/2013 | Chen | H04L 25/0272 327/509 |

* cited by examiner

CALIBRATION DEVICE AND MEMORY SYSTEM HAVING THE SAME

CROSS-REFERENCE TO RELATED APPLICATIONS

This application claims the benefit of U.S. Provisional Application No. 62/068,923, filed Oct. 27, 2014, the entire contents of which are incorporated herein by reference.

BACKGROUND

1. Field

Embodiments of the present disclosure relate to a memory system, and more particularly, to a calibration scheme for use in the memory system.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices (i.e., a data storage device). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Embodiments of the present disclosure are directed to a calibration device for use in a memory system.

Embodiments of the present disclosure provide a device to save pins and/or external components for impedance calibrations in a memory system.

Embodiments of the present disclosure provide an impedance calibration device without any off-chip components.

In accordance with an embodiment of the present invention, a calibration may include a bias circuit suitable for providing bias current, and a calibration unit suitable for generating a control signal for calibration. The bias circuit includes an internal resistor and is suitable for measuring a second bias current generated by mirroring a first bias current through the internal resistor, and adjust the second bias current to generate the second bias current in a predetermined range as a third bias current. The calibration unit is suitable for generating the control signal based on a comparison result between a reference voltage and a voltage generated based on the third bias current through an adjustable resistor.

In accordance with another embodiment of the present invention, a memory system may include a driver circuit and a calibration device. The calibration device includes a bias circuit suitable for providing a bias current, and a calibration unit suitable for generating a control signal for calibration. The bias circuit includes an internal resistor and is suitable for measuring a second bias current generated by mirroring a first bias current through the internal resistor, and adjust the second bias current to generate the second bias current in a predetermined range as the third bias current. The calibration unit is suitable for generating the control signal based on a comparison result between a reference voltage and a voltage generated based on the third bias current through an adjustable resistor.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

Figure 1:
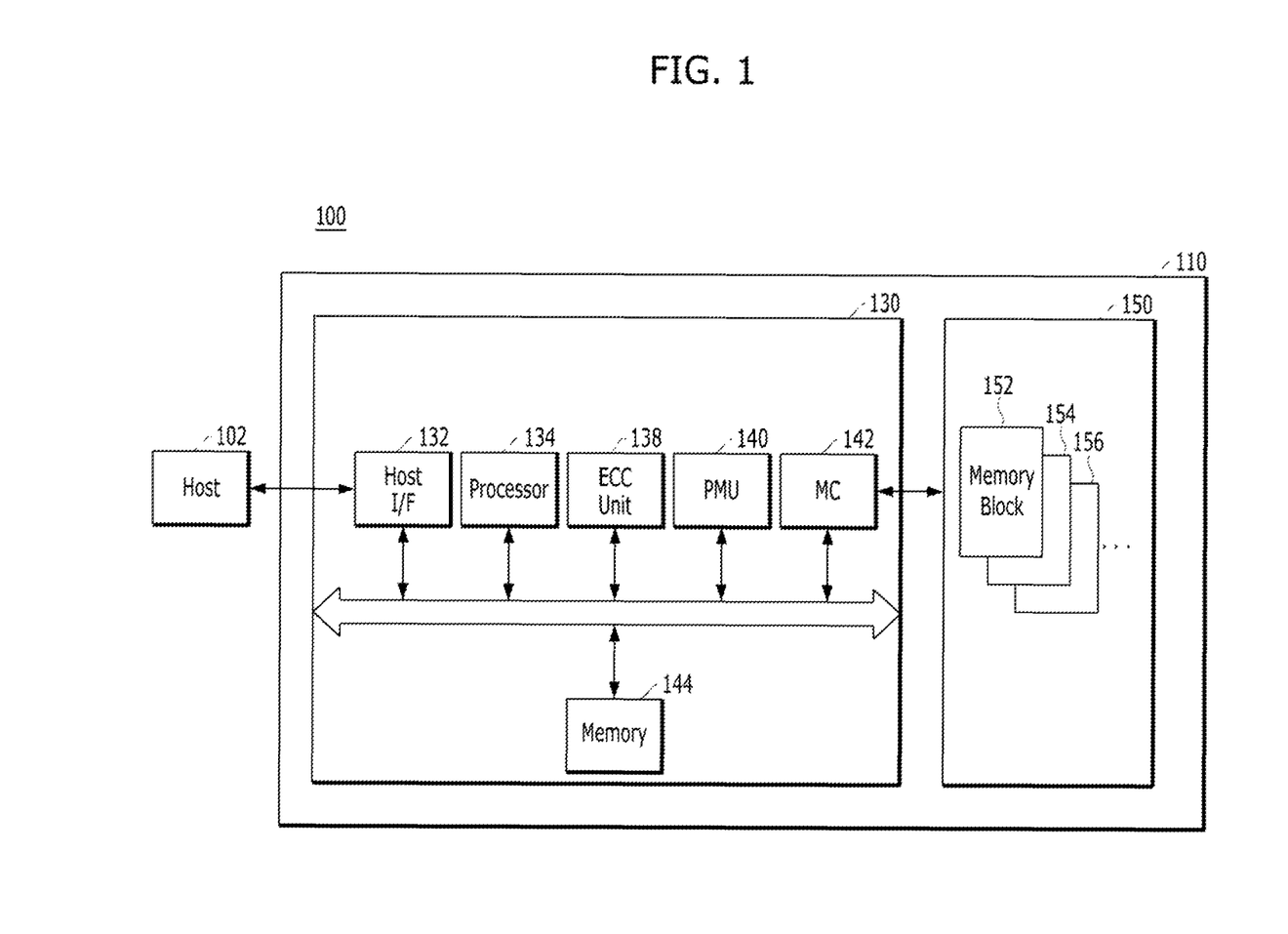
FIG. 1 illustrates a data processing system including a memory system.

FIG. 1 illustrates a data processing system 100 including a memory system. The data processing system 100 shown in FIG. 1 is for illustration only. Other constructions of the data processing system 100 could be used without departing from the scope of this disclosure. Although FIG. 1 illustrates one example of the data processing system 100, various changes may be made to FIG. 1. For example, the data processing system 100 may include any of elements, or may not include any of elements in any suitable arrangement.

Referring to FIG. 1, the data processing system 100 may include a host 102 and a memory system 110.

The host 102 may include, for example, a portable electronic device such as a mobile phone, an MP3 player, a laptop computer, an electronic device such as a desktop computer, a game player, a TV, a projector, etc.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory device 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

Additionally or alternatively, the memory system 110 may configure a computer, an ultra mobile personal computer (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a non-volatile memory device, for example, a flash memory. The flash memory may have a three-dimensional (3D) stack structure.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program, and erase operations.

The controller 130 may include a host interface unit 132, a processor 134, an error correction code (ECC) unit 138, a power management unit (PMU) 140, a memory controller (MC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The MC 142 may serve as a memory interface between the controller 130 and the memory device 150 to allow the controller 130 to control the memory device 150 in response to a request from the host 102. The MC 142 may generate control signals for the memory device 150 and process data under the control of the processor 134. When the memory device 150 is a flash memory such as a NAND flash memory, the MC 142 may generate control signals for the NAND flash memory 150 and process data under the control of the processor 134.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

As mentioned above, the memory system 110 may be implemented with an embedded storage such as an embedded Multi Media Card (eMMC). The eMMC is a widely used storage platform in the modern mobile devices, such as smart phones as well as tablet computers. The eMMC interface speed has increased (e.g., from below 50 Mbps to 400 Mbps) recently in order to meet increasing bandwidth demands. As the interface speed increases, it is more important to maintain good signal integrity (SI) at the interface, since the timing windows is tighter, and also because the transmission line effects are more pronounced at higher speeds.

Figure 2:
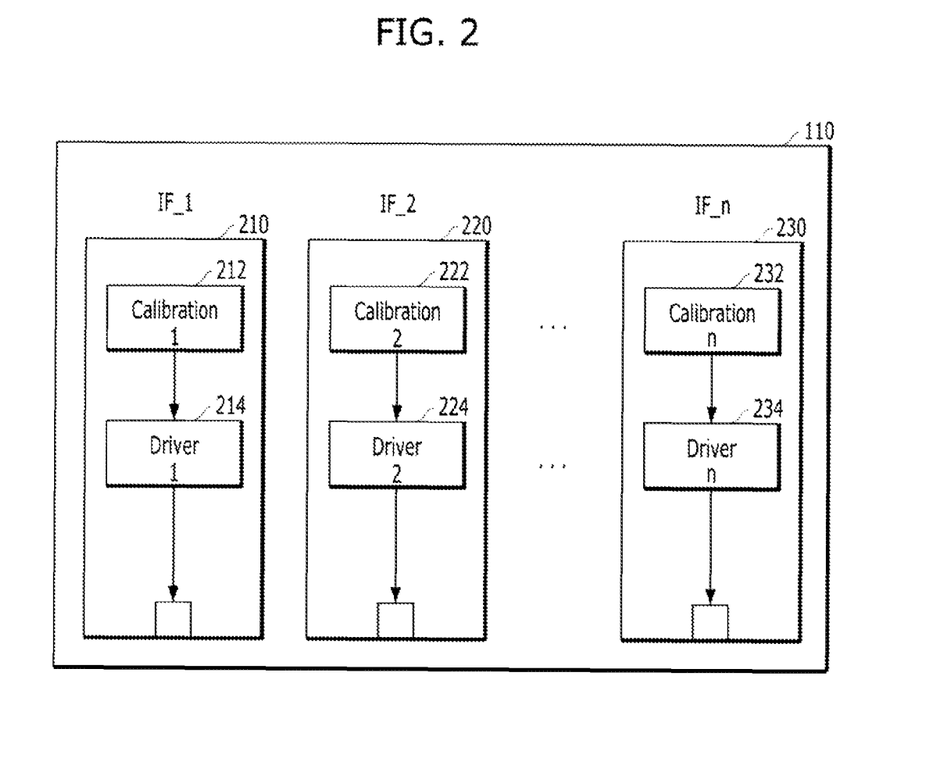
FIG. 2 is a block diagram of a memory system.

FIG. 2 is a block diagram of a memory system 200. For example, the memory system 200 may be the memory system 110 shown in FIG. 1.

Referring to FIG. 2, the memory system 200 includes a plurality of interface units IF_1 210, IF_2 220, through IF_n 230 and a memory device (e.g., the memory device 150 in FIG. 1). The interface units interface units IF_1 through IF_n 210, 220,230 provide an interface between the memory system 200 and a host (e.g., the host 102 in FIG. 1). The interface units IF_1 through IF_n 210, 220, 230 support one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), and integrated drive electronics (IDE). For example, the interface units 210, 220, 230 communicate with the host through eMMC interface protocol. Each of the interface units IF_1 through IF_n 210, 220, 230 includes a calibration unit and a driver unit. For example, the interface unit IF_1 210 includes a first calibration unit 212 and a first driver unit 214. Similarly, the interface unit IF_2 220 includes a second calibration unit 222 and a second driver unit 224, and the interface unit IF_n 230 includes an nth calibration unit 232 and an nth driver unit 234.

The input/output (IO) buffer output impedance is a key element of the SI. Typically, when the driver output impedance matches the transmission line impedance, the reflection can be minimized, resulting in lower jitter due to reflections. If the output impedance is not matched to the line (e.g., either too high or too low), portions of the signal may be reflected which can cause more jitter on the receiver and degrade the timing margin.

Most of system-on-chips (SOCs) these days are based on complementary metal-oxide-semiconductor (CMOS) processes. An example CMOS output driver is shown in FIG. 3.

Figure 3:
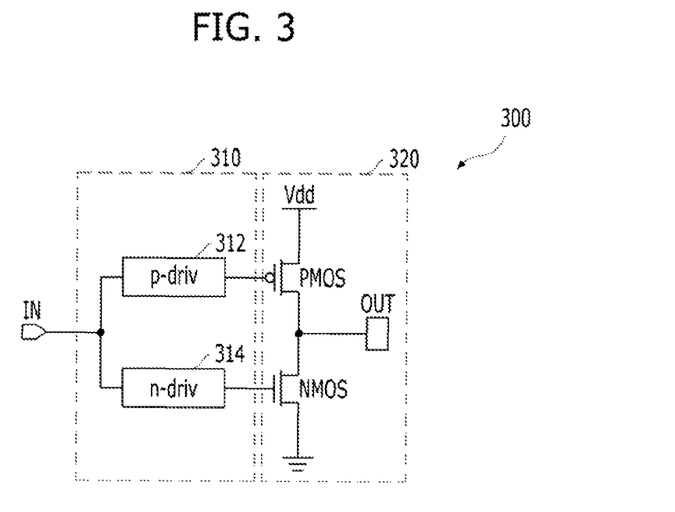
FIG. 3 depicts an example of an output driver for use in a memory system.

Referring to FIG. 3, the output driver 300 includes pre-drivers p-drv 312 and n-drv 314, and transistors PMOS and NMOS. The PMOS and NMOS are the driving transistors and are controlled by the pre-drivers p-drv 312 and n-drv 314, respectively. To control the driver impedance, the driver may be split into several pieces, as shown in FIG. 4A.

Figure 4A:
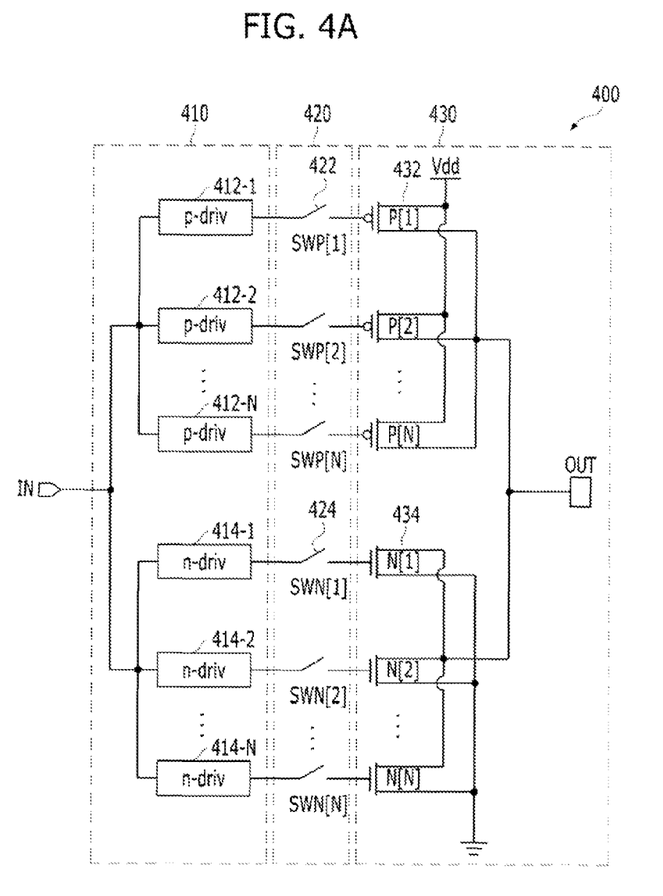
FIGS. 4A and 4B illustrate another example of an output driver for use in a memory system.

Referring to FIG. 4A, the output driver 400 includes a plurality of pre-drivers 410, a plurality of switches 420 and a plurality of output transistors 430. The pre-drivers 410 include a group of p-drivers p-drvs (412-1 through 412-N), and a group of n-drivers n-drvs (414-1 through 414-N). The switches 420 include a first group of switches 422 (SWP[1] through SWP[N]), and a second group of switches 424 (SWN[1] through SWN[N]). The output transistors 430 include a first group of transistors 432 (P[1] through P[N]), and a second group of transistors 434 (N[1] through N[N]). The first group of transistors 432 corresponds to the first group of switches 422. The first group of switches 422 corresponds to the group of p-drivers p-drvs 412-1 through 412-N. The second group of transistors 434 corresponds to the second group of switches 424. The second group of switches 424 corresponds to the group of n-drivers n-drvs 414-1 through 414-N. The first group of transistors 432 are controlled by the first group of switches 422. The second group of transistors 434 are controlled by the second group of switches 424. When a switch is on, the selected driver will contribute to the driving strength, and vice versa.

Figure 4B:
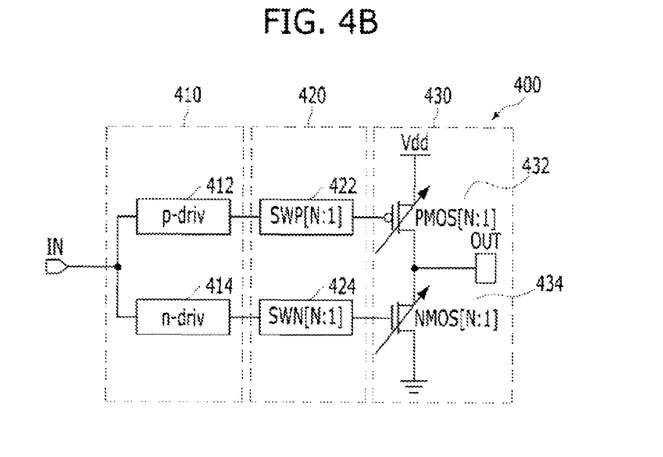

FIG. 4B illustrates an alternate view of the output driver 400 shown in FIG. 4A, as the CMOS driver with programmable strengths. Referring to FIG. 4B, the PMOS 432 are split into N pieces, which are controlled by N switches 422 SWP[1:N], respectively. The NMOS 434 are split into N pieces, which are controlled by N switches 424 SWN[1:N], respectively. Controlling the switches can set the output impedance. The more the switches are turned on, the lower the impedance it becomes.

The equations describing the impedances are shown below:

$$R_{PMOS} = \frac{1}{\sum_{j=1}^{m} \frac{1}{R_{PMOSj}}} \quad (1)$$

$$R_{NMOS} = \frac{1}{\sum_{j=1}^{l} \frac{1}{R_{NMOSj}}} \quad (2)$$

$$Rout = \frac{1}{\frac{1}{R_{PMOS}} + \frac{1}{R_{NMOS}}} \quad (3)$$

The m in Equation (1) represents the number of PMOS that are turned on. The k in Equation (2) represents the number of NMOS that are turned on. $R_{PMOS}$ represents the impedance for the PMOS, and $R_{PMOSj}$ represents the impedance for the j-th piece of the PMOS. $R_{NMOS}$ represents the impedance for the NMOS, and $R_{NMOSj}$ represents the impedance for the j-th piece of the NMOS. The overall impedance is the parallel impedance of PMOS and NMOS combined, shown in Equation (3). Note that the individual PMOS finger size PMOSj and the individual NMOS finger size NMOSj does not need to be equal to one another.

It may be desirable to know how to program the switches in FIG. 4A and FIG. 4B in order to tune the driver to the desired impedances such that the process, voltage and temperature (PVT) variations are all minimized. Calibration techniques can be used for this purpose. Some precision voltage(s), current(s), or resistance(s) may be used as the reference to achieve calibration accuracy. Since the precision voltage could be generated on-chip (e.g., using a Bandgap circuit), only the precision resistors need to be accommodated. In order to access the precision resistor(s), some extra pin(s) may have to be added in some embodiments.

In certain applications, such as eMMC, extra pins (for calibration) are not allowed due to standard pin-out limitation. A technique is described herein which provides the necessary support for IO calibration without the need of extra package pins. Furthermore, this technique requires no extra off-chip components, such as the on-package resistors, which take precious package-substrate real state, as well as increase manufacturing costs.

Figure 5:
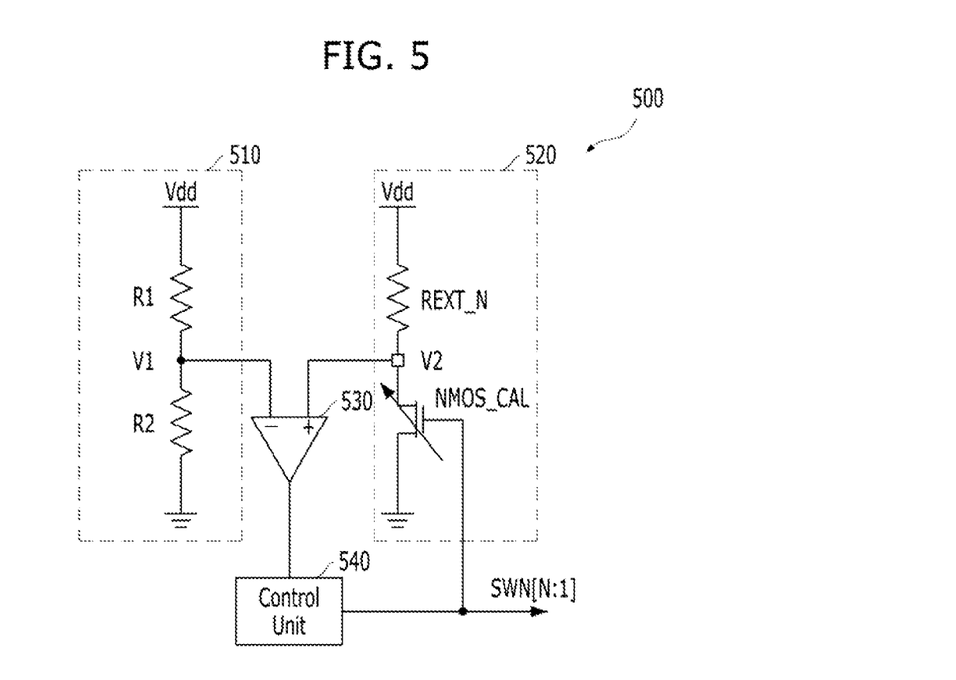
FIG. 5 illustrates an example of an NMOS calibration device for use in a memory system.

FIG. 5 depicts an example of an NMOS calibration device 500 for use in a memory system. For example, the NMOS calibration device 500 may be one of the plurality of calibration units 212-232 shown in FIG. 2.

Referring to FIG. 5, the NMOS calibration device 500 includes a first voltage generator 510, a second voltage generator 520, a comparator 530 and a control unit 540. The first voltage generator 510 includes resistors R1 and R2 coupled in series, which form a voltage divider. The first voltage generator 510 generates a reference voltage V1, where V1=Vdd*R2/(R1+R2). The second voltage generator 520 includes an external resistor REXT_N and a transistor NMOS_CAL coupled in series. The second voltage generator 520 generates a voltage V2, where V2=Vdd*RNMOS/(REXT_N+RNMOS), in which REXT_N represents a resistance of the resistor REXT_N, and RNMOS represents a resistance of the transistor NMOS_CAL.

The comparator 530 compares the reference voltage V1 with the voltage V2. The control unit 540 receives the comparison result from the comparator 530, and controls the switches (e.g., SWN[N:1] 424 in FIGS. 4A and 4B) based on the comparison result. The control unit 540 may be a state machine SM used to adjust the switches SWN[N:1]. Under the control of the control unit 540, the resistance of the driving transistor NMOS_CAL RNMOS changes, such that the voltage V2 converges toward the reference voltage V1.

Figure 6:
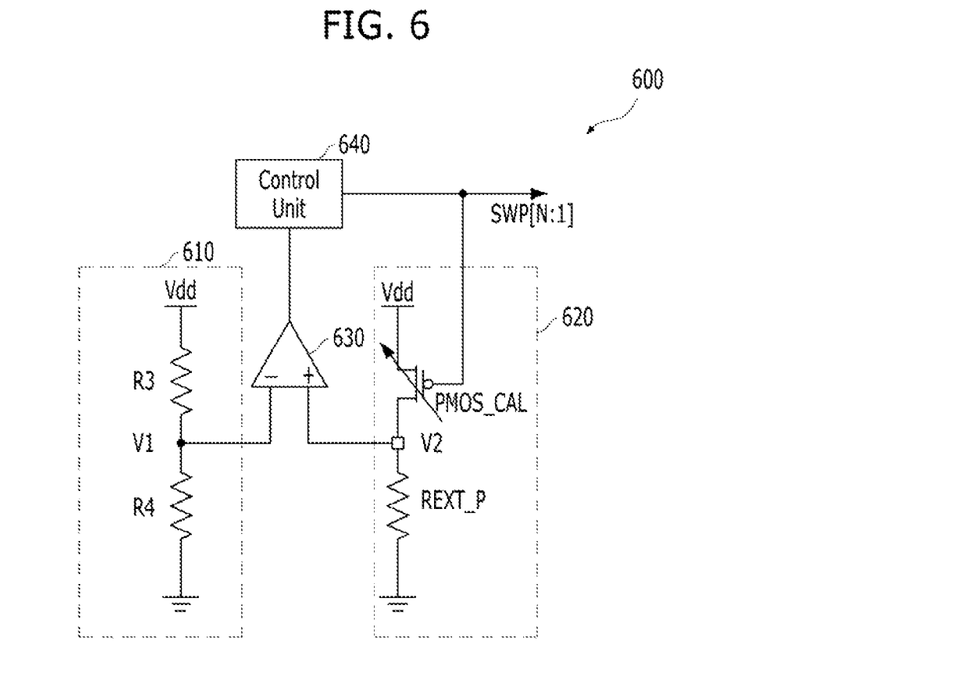
FIG. 6 illustrates an example of a PMOS calibration device for use in a memory system.

FIG. 6 illustrates an example of a PMOS calibration device 600 for use in a memory system. For example, the PMOS calibration device 600 may be one of the plurality of calibration units 212-232 shown in FIG. 2.

Referring to FIG. 6, the PMOS calibration device 600 includes a first voltage generator 610, a second voltage generator 620, a comparator 630 and a control unit 640. The first voltage generator 610 includes resistors R3 and R4 coupled in series, which form a voltage divider. The first voltage generator 610 generates a reference voltage V1 where V1=Vdd*R4/(R3+R4). The second voltage generator 620 includes a transistor PMOS_CAL and an external resistor REXT_P coupled in series. The second voltage generator 620 generates a voltage V2, where V2=Vdd*REXT_P/(RPMOS+REXT_P), in which REXT_P represents a resistance of the resistor REXT_P, and RPMOS represents a resistance of the transistor PMOS_CAL.

The comparator 630 compares the reference voltage V1 with the voltage V2. The control unit 640 receives the comparison result from the comparator 630, and controls the switches (e.g., SWP[N:1] 422 in FIGS. 4A and 4B) based on the comparison result. The control unit 640 may be a state machine SM used to adjust the switches SWP[N:1]. Under the control of the control unit 640, the resistance of the driving transistor PMOS_CAL RPMOS changes, such that the voltage V2 converges toward the reference voltage V1.

Figure 7A:
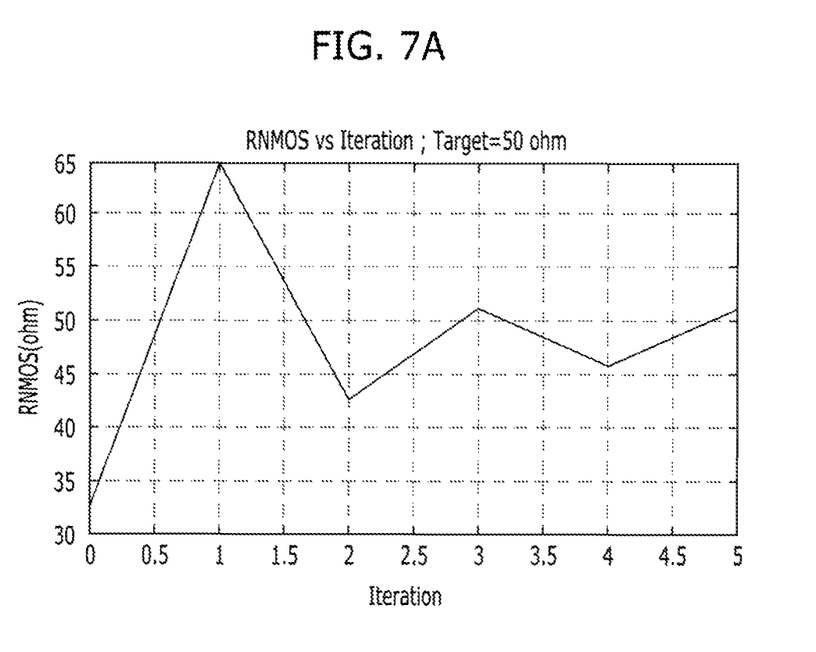
FIGS. 7A and 7B illustrate examples of calibrations by an NMOS calibration device for use in a memory system.
Figure 7B:
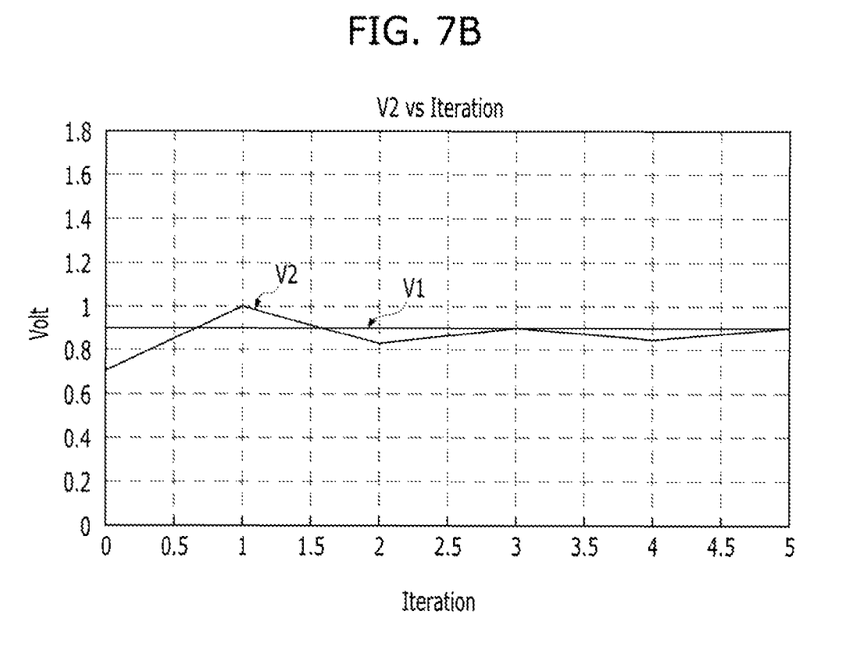

FIGS. 7A and 7B illustrate examples of calibrations by an NMOS calibration device for use in a memory system. For example, the NMOS calibration device may be the calibration device 500 shown in FIG. 5 and/or the calibration device 600 shown in FIG. 6. The examples of calibrations correspond to the case which uses a binary search.

FIG. 7A shows changes of the NMOS resistance RNMOS over iterations (for target=50 ohm), and FIG. 7B shows the voltage V2 over iterations, with V1=0.9V. After calibration, V2 converges toward V1. The residual difference is due to quantization error. The acquired code, appeared on SWN[N:1], can then be applied to the slaved IO drivers, which are nominally matched to the calibration master circuits.

In some configurations where a memory system including eMMC incorporating several NAND chips and a controller SOC (e.g., packaged onto a package substrate), it may be possible to add two more resistors (as in FIGS. 5 & 6) for IO calibration. The benefits must be weighted, however, since such approach may be very costly, as most of the substrate area is used to carry the chips and for signal/power routings. Furthermore, integrating additional components adds assembly time, as well as cost extra materials.

Figure 8A:
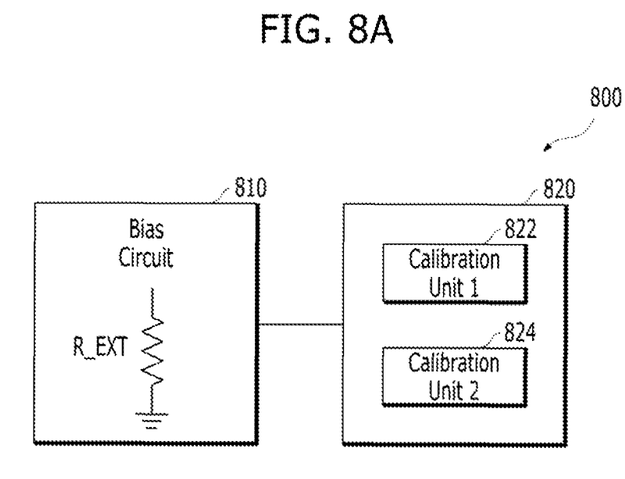
FIGS. 8A and 8B illustrate block diagrams of a calibration device in accordance with embodiments of the present invention.
Figure 8B:
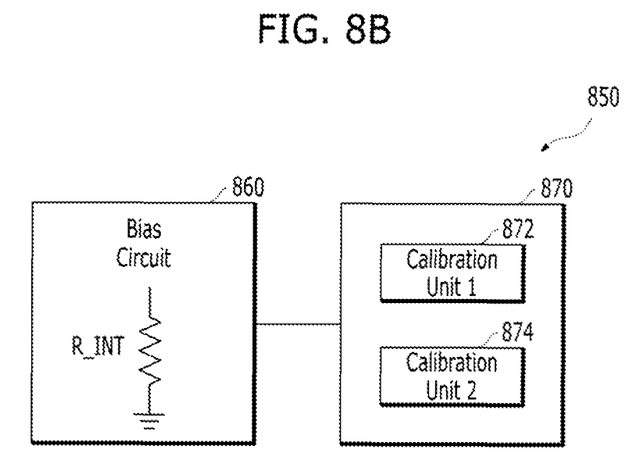

FIGS. 8A and 8B are block diagrams of a calibration device in accordance with embodiments of the present invention. The calibration devices are to reduce the number of resistors.

Referring to FIG. 8A, the calibration device 800 includes a bias circuit 810 and a calibration circuit 820. The calibration circuit 820 includes two calibration units (e.g., a first calibration unit 822 and a second calibration unit 824). The calibration device 800 uses a single external resistor R_EXT. The calibration device 800 may be implemented by elements as shown in FIG. 9 and FIG. 10 described below, although the calibration device 800 is not limited to such implementations.

Figure 11:
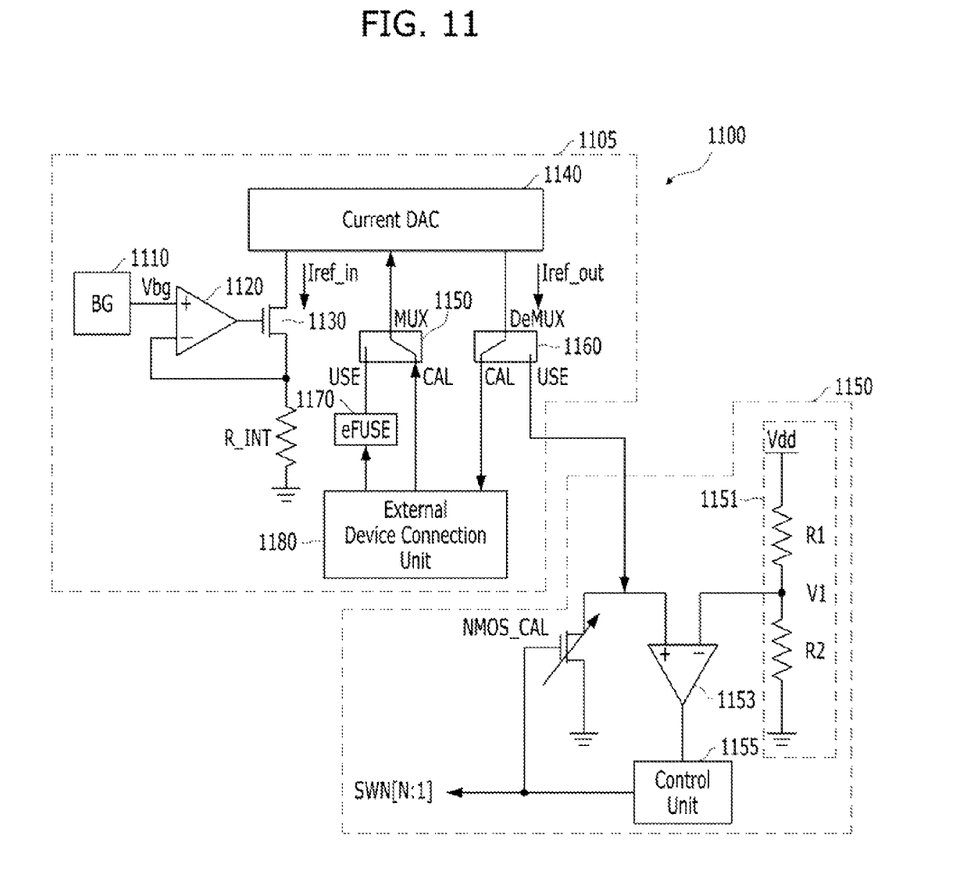
FIGS. 11 and 12 illustrate circuit diagrams of a calibration device in accordance with another embodiment of the present invention.
Figure 12:
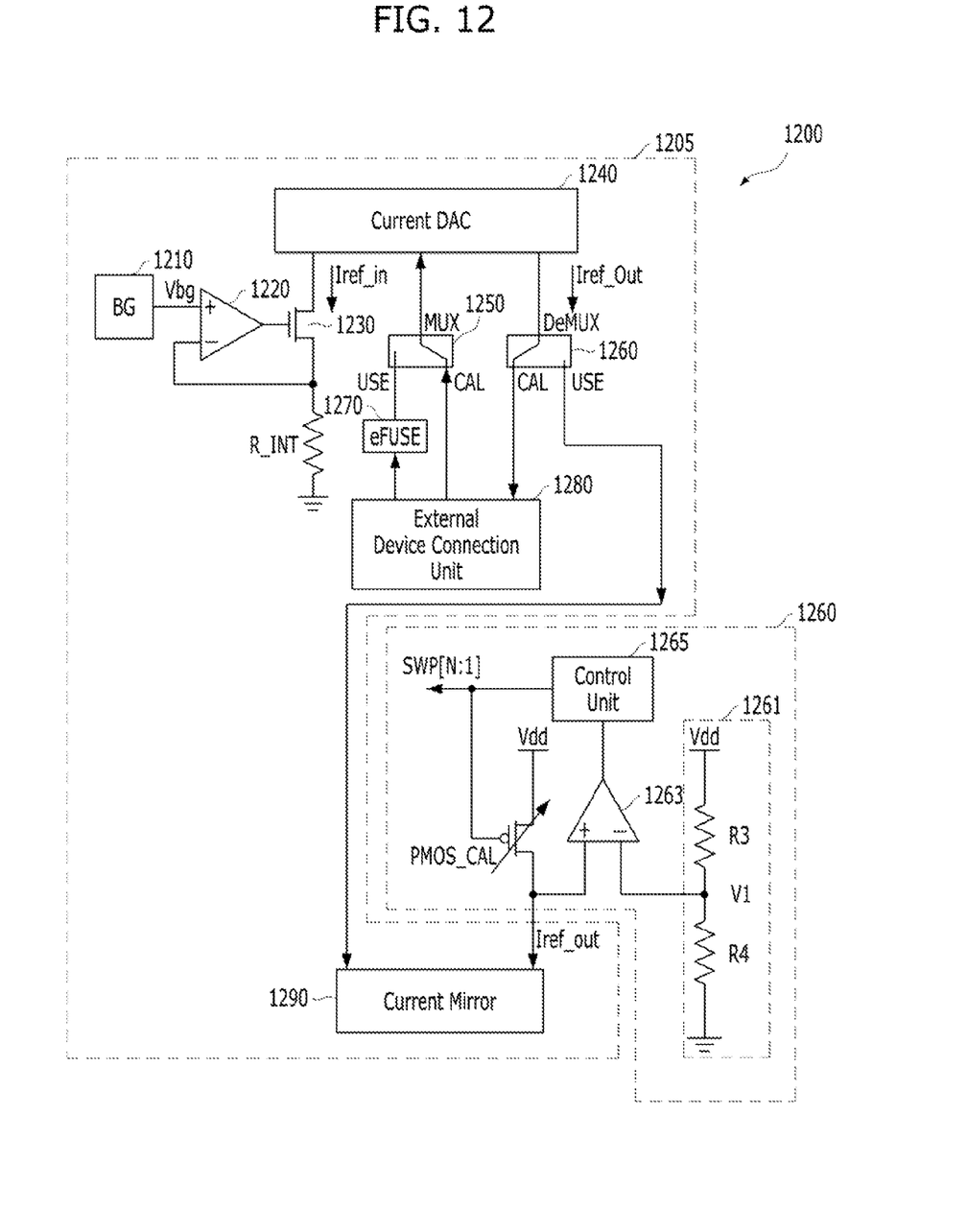

Referring to FIG. 8B, the calibration device 850 includes a bias circuit 860 and a calibration circuit 870. The calibration circuit 870 includes two calibration units (e.g., a first calibration unit 872 and a second calibration unit 874). The calibration device 850 uses an internal resistor R_INT without using an external resistor, for example, R_EXT. The calibration device 850 may be implemented by elements as shown in FIG. 11 and FIG. 12 described below, although the calibration device 850 is not limited to such implementations.

Figure 9:
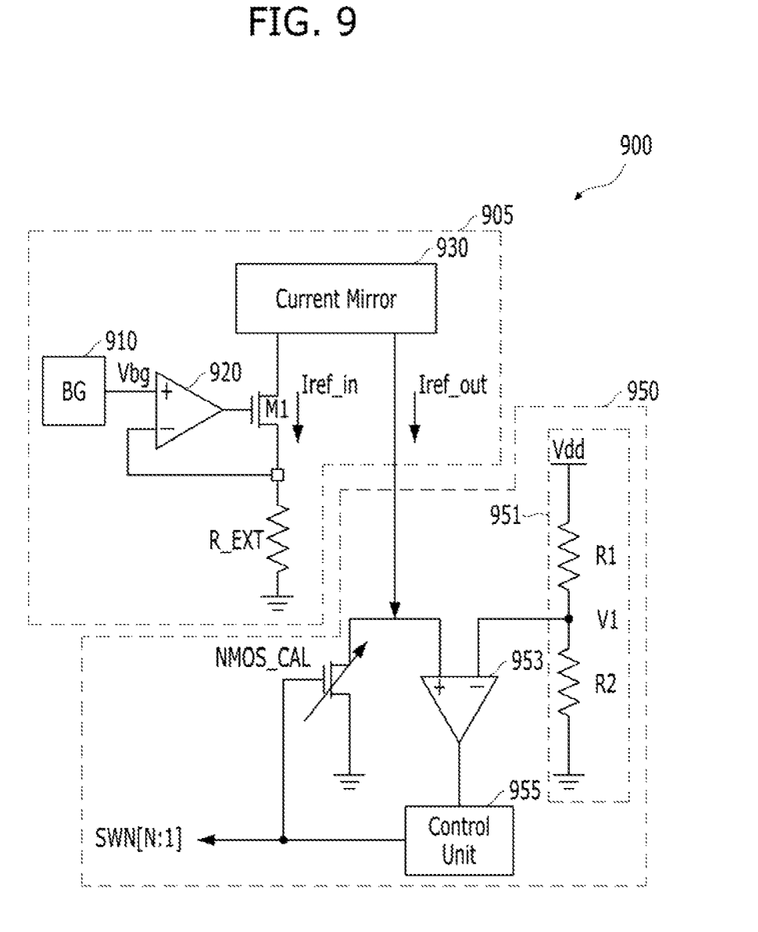
FIGS. 9 and 10 illustrate circuit diagrams of a calibration device in accordance with an embodiment of the present invention.
Figure 10:
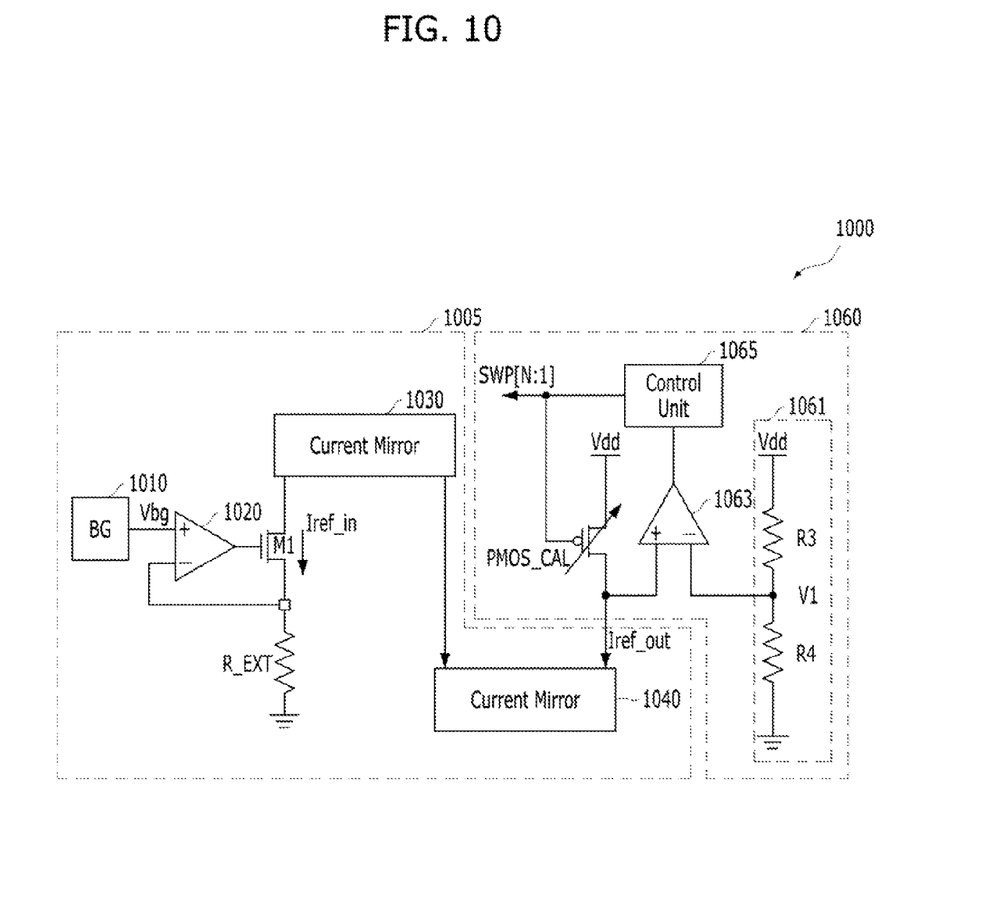

FIG. 9 illustrates a circuit diagram of a calibration device 900 in accordance with an embodiment of the present invention. For example, the calibration device 900 for NMOS calculation may include one of calculation units 822, 824 and/or the bias circuit 810 described in FIG. 8A.

Referring to FIG. 9, the calibration device 900 includes a bias circuit 905 suitable for providing a bias current, and a calibration unit 950 suitable for generating a control signal for calibration based on the bias current.

The bias circuit 905 includes an external resistor R_EXT, a bandgap (BG) voltage generator 910, an amplifier 920, a transistor M1, and a current mirror block 930.

The transistor M1 and the external resistor R_EXT are coupled in series. The bandgap voltage generator 910 generates a bandgap voltage Vbg. The amplifier 920, compares the bandgap voltage Vbg with a voltage of the resistor R_EXT corresponding to an input reference current Iref_in as a bias current, and outputs the comparison result to the transistor M1.

A precision reference current can be generated as Iref_in=Vbg/R_EXT. With a current mirror block 930, the output reference current Iref_out is scaled as:

$$\text{Iref\_out} = k \cdot \text{Iref\_in} = k \cdot \frac{Vbg}{R\_EXT} \quad (4)$$

The calibration unit 950 includes a reference voltage generator 951, a transistor NMOS_CAL, an amplifier 953, and a control unit 955.

The reference voltage generator 951 includes two resistors R1, R2 functioning as a voltage divider, and generates a reference voltage V1. The transistor NMOS_CAL is coupled to the bias circuit 905. The transistor NMOS_CAL functions as an adjustable resistor. The amplifier 953, functioning as a comparator, compares the reference voltage V1 with a voltage corresponding the current through the transistor NMOS_CAL. The control unit 955 generates a control signal SWN[N:1] for calibration based on the comparison result, and outputs the control signal to the transistor NMOS_CAL operating as the adjustable resistor and a driver for calibration (e.g., driver 434 in FIGS. 4A and 4B).

The control unit 955 may be implemented by a state machine (SM) and may be used to control the calibration loop. After calibration, the following equation describes the result:

$$R_{NMOS} = R\_EXT \cdot \frac{V1}{k \cdot Vbg} = R\_EXT \cdot \frac{Vdd}{k \cdot Vbg} \cdot \frac{R2}{R1+R2} \quad (5)$$

FIG. 10 illustrates a circuit diagram of a calibration device 1000 in accordance with an embodiment of the present invention. For example, the calibration device 1000 for PMOS calculation may include one of calculation units 822, 824 and/or the bias circuit 810 described in FIG. 8A.

Referring to FIG. 10, the calibration device 1000 includes a bias circuit 1005 suitable for providing a bias current, and a calibration unit 1060 suitable for generating a control signal for calibration based on the bias current.

The bias circuit 1005 includes an external resistor R_EXT, a bandgap (BG) voltage generator 1010, an amplifier 1020, a transistor M1, and two current mirror blocks 1030, 1040.

The transistor M1 and the external resistor R_EXT are coupled in series. The bandgap voltage generator 1010 generates a bandgap voltage Vbg. The amplifier 1020, compares the bandgap voltage Vbg with a voltage of the resistor R_EXT corresponding to an input reference current Iref_in as a bias current, and outputs the comparison result to the transistor M1.

Due to additional mirror block 1040, the current direction can be switched and the PMOS of the calibration unit 1060 can be calibrated using the same resistor R_EXT shown in FIG. 9.

The calibration unit 1060 includes a reference voltage generator 1061, a transistor PMOS_CAL, an amplifier 1063, and a control unit 1065.

The reference voltage generator 1061 includes two resistors R3, R4 functioning as a voltage divider, and generates a reference voltage V1. The transistor PMOS_CAL is coupled to the bias circuit 1005. The transistor PMOS_CAL functions as an adjustable resistor. The amplifier 1063, functioning as a comparator, compares the reference voltage V1 with a voltage corresponding the current through the transistor PMOS_CAL. The control unit 1065 generates a control signal SWP[N:1] for calibration based on the comparison result, and outputs the control signal to the transistor PMOS_CAL operating as the adjustable resistor and a driver for calibration (e.g., driver 432 in FIGS. 4A and 4B).

The control unit 1065 may be implemented by a state machine (SM) and may be used to control the calibration loop.

Using schemes shown in FIG. 9 and FIG. 10, a single resistor R_EXT may be used for calibration. This resistor may be incorporated on the substrate of the memory system such as eMMC.

FIGS. 11 and 12 illustrate circuit diagrams of a calibration device in accordance with another embodiment of the present invention. For example, the calibration device 1100 of FIG. 11 and the calibration device 1200 of FIG. 12 may include one of calculation units 872, 874 and/or the bias circuit 860 described in FIG. 8B. Instead of using an external resistor, this embodiment uses an internal resistor R_INT. The resistor R_INT may be built with a low temperature-coefficient material.

Referring to FIG. 11, the calibration device 1100 includes a bias circuit 1105 suitable for providing a bias current, and a calibration unit 1150 suitable for generating a control signal for calibration based on the bias current.

The bias circuit 1105 includes an internal resistor R_INT. The bias circuit 1105 measures an output reference current generated by mirroring an input reference current Iref_in through the internal resistor R_INT, and adjusts the output reference current to generate the adjusted output reference current in a predetermined range as the output current Iref_out. The predetermined range can be based on internal bias needs and noise (impedance level) considerations, such as about 50 microampere (uA).

The calibration unit 1150 generates a control signal SWN [N:1] based on a comparison result between a reference voltage V1 and a voltage generated based on the output current Iref_out through a transistor NMOS_CAL functioning as an adjustable resistor.

During a manufacturing phase of the calibration device 1100, the bias circuit 1105 measures the output reference current, and adjusts the output reference current to generate the adjusted output reference current. During a normal operation of the calibration device 1100, the bias circuit 1105 outputs the adjusted output reference as the output current Iref_out to the calibration unit 1150.

The bias circuit 1105 includes a current generation block including the internal resistor R_INT, and a current digital-to-analog converter (DAC) 1140. The current generation block generates the input reference current Iref_in flow through the internal resistor R_INT. The current generation block includes the internal resistor R_INT, a bandgap (BG) voltage generator 1110, an amplifier 1120, and a transistor 1130. The bandgap voltage generator 1110 generates a bandgap voltage Vbg. The amplifier 1120 compares the bandgap voltage Vbg with a voltage of the internal resistor R_INT corresponding to the input reference current Iref_in, and outputs the comparison result to the transistor 1130. The transistor 1130 is coupled between the current DAC 1140 and the internal resistor R_INT in series.

The current DAC 1140 receives an Input DAC code, and outputs currents based on the DAC code and the input reference current Iref_in. During the manufacturing phase, the current DAC 1140 may generate the input reference current Iref_in as a first input bias current and the output reference current as a first output bias current. Also, during the normal operation, the current DAC 1140 may generate the input reference current Iref_in as a second input bias current and the output current as a second output bias current Iref_out.

The bias circuit 1105 further includes eFUSE 1170 as a kind of one-time programmable memory to store a DAC code corresponding to the third bias current Iref_out.

During the manufacturing phase, the current DAC 1140 receives the input DAC code from external, and outputs the output reference current to the external. During the normal operation, the current DAC 1140 receives the input DAC code from the programmable memory 1170, and outputs the output current Iref_out to the calibration unit 1150.

The bias circuit 1105 further includes a multiplexer (MUX) 1150 and a demultiplexer (DeMUX) 1160. MUX 1150 is coupled between the current DAC 1140 and one of the external and the programmable memory 1170. MUX 1150 provides the current DAC 1140 with the input DAC code from one of the external and the programmable memory 1170. DeMUX 1160 is coupled between the current DAC 1140 and one of the external device and the calibration unit 1150. DeMUX 1160 outputs the output reference current to the external or outputs the output current, e.g., Iref_out, to the calibration unit 1150.

The bias circuit 1105 further includes an external device connection unit 1180. The external device senses the current via a common test pin ITO (not shown). The external device provides the input DAC code via a serial port (not shown).

The calibration unit 1150 includes a reference voltage generator 1151, a transistor NMOS_CAL, an amplifier 1153, and a control unit 1155.

The reference voltage generator 1151 includes two resistors R1, R2 functioning as a voltage divider and generates a reference voltage V1. The transistor NMOS_CAL is coupled to the bias circuit 1105. The transistor NMOS_CAL functions as an adjustable resistor. The amplifier 1153, functioning as a comparator, compares the reference voltage V1 with a voltage corresponding the current through the transistor NMOS_CAL. The control unit 1155 generates a control signal SWN[N:1] for calibration based on the comparison result, and outputs the control signal to the transistor NMOS_CAL operating as the adjustable resistor and a driver for calibration (e.g., driver 434 in FIGS. 4A and 4B).

The calibration device 1100 measures the output reference current during the manufacturing phase, and then adjusts the output reference current via an on-chip current DAC 1140 based on the measurement result, such that the output reference current is in the desired range. The resulting DAC code is then programmed into the eFUSE 1170 (a kind of one-time programmable memory), which can be retrieved during normal operation.

MUX 1150 and DeMUX 1160 are set in the "CAL" position during the manufacturing phase to allow external programming (e.g., via a serial port) and current sensing (e.g. via a common test pin ITO) by the external device connection unit 1180. Once the DAC code is found, eFUSE 1170 will be programmed accordingly.

During the normal operation, MUX 1150 and DeMUX 1160 are be set to the "USE" position, and data of eFUSE 1170 then selected as the previously calibrated value to generate the desired output current Iref_out for calibration purpose. The operation of the calibration is very similar to FIG. 9.

Referring to FIG. 12, the calibration device 1200 includes a bias circuit 1205 suitable for providing a bias current, and a calibration unit 1260 suitable for generating a control signal for calibration based on the bias current.

The bias circuit 1205 includes an internal resistor R_INT. The bias circuit 1205 measures an output reference current generated by mirroring an input reference current Iref_in through the internal resistor R_INT, and adjusts the output reference current to generate the adjusted output reference current in a predetermined range as the output current Iref_out.

The calibration unit 1260 generates a control signal SWP[N:1] based on a comparison result between a reference voltage V1 and a voltage generated based on the output current Iref_out through a transistor PMOS_CAL as an adjustable resistor.

During a manufacturing phase of the calibration device 1100, the bias circuit 1205 measures the output reference current, and adjusts the output reference current to generate the adjusted output reference current. During a normal operation of the calibration device 1200, the bias circuit 1205 outputs the adjusted output reference as the output current Iref_out to the calibration unit 1260.

The bias circuit 1205 includes a current generation block including the internal resistor R_INT, a current digital-to-analog converter (DAC) 1240, and a current mirror block 1290.

The current generation block generates the input reference current Iref_in flow through the internal resistor R_INT. The current generation block includes the internal resistor R_INT, a bandgap (BG) voltage generator 1210, an amplifier 1220, and a transistor 1230. The bandgap voltage generator 1210 generates a bandgap voltage Vbg. The amplifier 1220, functioning as a comparator, compares the bandgap voltage Vbg with a voltage of the internal resistor R_INT corresponding to the input reference current Iref_in, and outputs the comparison result to the transistor 1230. The transistor 1230 is coupled between the current DAC 1240 and the internal resistor R_INT in series.

The current DAC 1240 receives an input DAC code, and outputs currents based on the DAC code and the input reference current Iref_in. During the manufacturing phase, the current DAC 1240 may generate the input reference current Iref_in as a first input bias current and the output reference current as a first output bias current. Also, during the normal operation, the current DAC 1240 may generate the input reference current Iref_in as a second input bias current and the output current as a second output bias current Iref_out.

The bias circuit 1205 further includes eFUSE 1270 as a kind of one-time programmable memory to store a DAC code corresponding to the third bias current Iref_out.

During the manufacturing phase, the current DAC 1240 receives the input DAC code from external, and outputs the output reference current to the external. During the normal operation, the current DAC 1240 receives the input DAC code from the programmable memory 1270, and outputs the output current Iref_out to the calibration unit 1260 via the current mirror block 1290.

The bias circuit 1205 further includes a multiplexer (MUX) 1250 and a demultiplexer (DeMUX) 1260. MUX 1250 is coupled between the current DAC 1240 and one of the external and the programmable memory 1270. MUX 1250 provides the current DAC 1240 with the input DAC code from one of the external and the programmable memory 1270. DeMUX 1260 is coupled between the current DAC 1240 and one of the external and the calibration unit 1260. DeMUX 1260 outputs the output reference current to the external or outputs the output current, e.g., Iref_out, to the calibration unit 1260 via the current mirror block 1290.

The bias circuit 1205 further includes an external device connection unit 1280. The external device senses the current via a common test pin ITO (not shown). The external device provides the input DAC code via a serial port (not shown).

The calibration unit 1260 includes a reference voltage generator 1261, a transistor PMOS_CAL, an amplifier 1263, and a control unit 1265.

The reference voltage generator 1261 includes two resistors R3, R4 functioning as a voltage divider and generates a reference voltage V1. The transistor PMOS_CAL is coupled to the bias circuit 1205. The transistor PMOS_CAL functions as an adjustable resistor. The amplifier 1263, functioning as a comparator, compares the reference voltage V1 with a voltage corresponding the current through the transistor PMOS_CAL. The control unit 1265 generates a control signal SWP[N:1] for calibration based on the comparison result, and outputs the control signal to the transistor PMOS_CAL operating as the adjustable resistor and a driver for calibration (e.g., driver 432 in FIGS. 4A and 4B).

Due to the current mirror block 1290, the current direction can be switched and the PMOS of the calibration unit 1260 can be calibrated using the same resistor R_INT shown in FIG. 11.

Using the proposed calibration device in FIG. 11 and FIG. 12, there is no need for any off-chip resistor(s). Furthermore, there is no additional package pin, since the ITO pad is only used for wafer-level testing. With this calibration device, accurate IO impedance calibration is achieved during the normal operation, without any external components.

As is shown in the figures above, accurate IO impedance calibrations are able to be performed without any off-chip components. Traditional techniques require at least one off-chip resistor, and it has to be on-package due to the standard pin-out constraint of memory system such as eMMC.

While the present invention has been particularly shown and described with reference to exemplary embodiments thereof, it will be understood by those of ordinary skill in the art that various changes in form and details may be made therein without departing from the spirit and scope of the present invention as defined by the following claims. Thus, the foregoing is by way of example only and is not intended to be limiting. For example, any numbers of elements illustrated and described herein are by way of example only. The present invention is limited only as defined in the following claims and equivalents thereof.

What is claimed is:

1. A calibration device comprising:
a bias circuit configured to provide bias current; and
a calibration unit configured to generate a control signal for calibration,
wherein the bias circuit includes an internal resistor and is configured to measure a second bias current generated by mirroring a first bias current through the internal resistor, and adjust the second bias current to generate a third bias current in a predetermined range, an eFuse is configured to store a DAC code corresponding to the third bias current, an external device connection unit configured to provide an input DAC code via a serial port and sense the second bias current via a common test pin in a manufacturing phase of the calibration device; and
wherein the calibration unit is configured to generate the control signal based on a comparison result between a reference voltage and a voltage generated based on the third bias current through an adjustable resistor.

2. The device of claim 1, wherein the bias circuit is configured to
measure the second bias current, and adjust the second bias current to generate the third bias current, during the manufacturing phase of the calibration device, and
output the third bias current to the calibration unit during a normal operation of the calibration device.

3. The device of claim 2, wherein the bias circuit comprises:
a current generation block including the internal resistor, configured to generate the first bias current flow through the internal resistor; and
a current digital-to-analog converter (DAC) configured to receive an input DAC code, and output the second bias current and the third bias current based on the DAC code and the first bias current.

4. The device of claim 3, wherein during the manufacturing phase, the current DAC is configured to receive the input DAC code from an external device, and output the second bias current to the external device, and
during the normal operation, the current DAC is configured to receive the input DAC code from the eFuse, and output the third bias current to the calibration unit.

5. The device of claim 4, further comprising:
a multiplexer coupled between the current DAC and one of the external device and the eFuse, configured to provide the current DAC with the input DAC code from one of the external device and the eFuse; and
a demultiplexer coupled between the current DAC and one of the external device and the calibration unit, configured to output the second bias current to the external device and output the third bias current to the calibration unit.

6. The device of claim 3, wherein the current generation block comprises:
 a reference transistor coupled between the current DAC and the internal resistor in series;
 a bandgap voltage generator configured to generate a bandgap voltage; and
 a comparator configured to compare the bandgap voltage with a voltage of the internal resistor corresponding to the first bias current, and output the comparison result to the reference transistor.

7. The device of claim 1, wherein the calibration unit comprises:
 a calibration transistor coupled to the bias circuit;
 a reference voltage generator configured to generate a reference voltage;
 a comparator configured to compare the reference voltage with a voltage corresponding the third bias current through the calibration transistor; and
 a control unit configured to generate the control signal based on the comparison result, and output the control signal to the calibration transistor as the adjustable resistor and a driver for calibration.

8. The device of claim 1, wherein the internal resistor includes a low temperature-coefficient material.

9. A memory system comprising:
 a driver circuit; and
 a calibration device,
 wherein the calibration device comprises:
 a bias circuit configured to provide bias current; and
 a calibration unit configured to generate a control signal for calibration of the driver circuit,
 wherein the bias circuit includes an internal resistor and is configured to measure a second bias current generated by mirroring a first bias current through the internal resistor, and adjust the second bias current to generate the second bias current as a third bias current in a predetermined range, an eFuse is configured to store a DAC code corresponding to the third bias current, an external device connection unit configured to provide an input DAC code via a serial port and sense the second bias current via a common test pin in a manufacturing phase of the calibration device; and
 wherein the calibration unit is configured to generate the control signal based on a comparison result between a reference voltage and a voltage generated based on the third bias current through an adjustable resistor.

10. The system of claim 9, wherein the bias circuit is configured to
 measure the second bias current, and adjust the second bias current to generate the third bias current, during the manufacturing phase of the calibration device, and output the third bias current to the calibration unit during a normal operation of the calibration device.

11. The system of claim 10, wherein the bias circuit comprises:
 a current generation block including the internal resistor, configured to generate the first bias current flow through the internal resistor; and
 a current digital-to-analog converter (DAC) configured to receive an input DAC code, and output the second bias current and the third bias current based on the DAC code and the first bias current.

12. The system of claim 11, wherein during the manufacturing phase, the current DAC is configured to receive the input DAC code from an external device, and output the second bias current to the external device, and
 during the normal operation, the current DAC is configured to receive the input DAC code from the eFuse, and output the third bias current to the calibration unit.

13. The system of claim 12, further comprising:
 a multiplexer coupled between the current DAC and one of the external device and the eFuse, configured to provide the current DAC with the input DAC code from one of the external device and the eFuse; and
 a demultiplexer coupled between the current DAC and one of the external device and the calibration unit, configured to output the second bias current to the external device and output the third bias current to the calibration unit.

14. The system of claim 11, wherein the current generation block comprises:
 a reference transistor coupled between the current DAC and the internal resistor in series;
 a bandgap voltage generator configured to generate a bandgap voltage; and
 a comparator configured to compare the bandgap voltage with a voltage of the internal resistor corresponding to the first bias current, and output the comparison result to the reference transistor.

15. The system of claim 9, wherein the calibration unit comprises:
 a calibration transistor coupled to the bias circuit;
 a reference voltage generator configured to generate a reference voltage;
 a comparator configured to compare the reference voltage with a voltage corresponding the third bias current through the calibration transistor; and
 a control unit configured to generate the control signal based on the comparison result, and output the control signal to the calibration transistor as the adjustable resistor and a driver for calibration.

16. The system of claim 9, wherein the internal resistor includes a low temperature-coefficient material.

* * * * *